(12) United States Patent
Gaied et al.

(10) Patent No.: US 8,957,740 B2
(45) Date of Patent: Feb. 17, 2015

(54) LOW POWER OSCILLATOR WITH NEGATIVE RESISTANCE BOOSTING

(71) Applicant: Intel Mobile Communications GmbH, Neubiberg (DE)

(72) Inventors: David Gaied, Cairo (EG); Emad Hegazi, Cairo (EG); Karim Hussein, Cairo (EG)

(73) Assignee: Intel Mobile Communications GmbH, Neubiberg (DE)

( * ) Notice: Subject to any disclaimer, the term of this patent is extended or adjusted under 35 U.S.C. 154(b) by 8 days.

(21) Appl. No.: 13/803,737

(22) Filed: Mar. 14, 2013

(65) Prior Publication Data

US 2014/0266478 A1 Sep. 18, 2014

(51) Int. Cl.
*H03B 5/32* (2006.01)
*H03L 7/02* (2006.01)
*H03B 5/36* (2006.01)

(52) U.S. Cl.
CPC ... *H03L 7/02* (2013.01); *H03B 5/36* (2013.01)
USPC .............. 331/158; 331/116 R; 331/116 FE; 331/183

(58) Field of Classification Search
CPC ........................................ H03B 5/00
USPC ....... 331/158, 116 R, 116 FE, 167, 36 C, 183
See application file for complete search history.

(56) References Cited

U.S. PATENT DOCUMENTS 6,759,914 B2 * 7/2004 Rusznyak ............... 331/116 FE

* cited by examiner

*Primary Examiner* — Arnold Kinkead
(74) *Attorney, Agent, or Firm* — Schwegman Lundberg & Woessner, P.A.

(57) ABSTRACT

Representative implementations of devices and techniques provide increased negative resistance to an oscillator circuit. A capacitance divider and/or a feedback loop may be employed to increase the negative resistance of the oscillator circuit at the same current consumption and with the same load capacitance. Further, a constant bias circuit may be employed to conserve and/or reduce the current consumption of the oscillator circuit.

23 Claims, 7 Drawing Sheets

LOW POWER OSCILLATOR WITH NEGATIVE RESISTANCE BOOSTING

BACKGROUND

Resonance-type oscillators generate an oscillating signal having a frequency based on the natural resonance frequency of the resonator. Additionally, such oscillators may include a current source (an amplifier core, for example) to supply constant energy to the resonant circuit and replenish its intrinsic losses. Generally, to have a low-power mode of operation, the core is sized to have the maximum transconductance (gm) for a given bias current. However, if the negative resistance of the core is not sufficient (e.g., internal losses of the resonant circuit are greater than the negative resistance), the oscillations may be damped. In such a case, the core's current may be increased until the negative resistance is sufficient, and the core may be resized to have the maximum gm for the new current. In many cases, this can result in greater power consumption by the oscillator circuit, based on the resized core and/or increased current.

Additionally, the load capacitance seen by the resonator may be reduced to the minimum value possible for the best negative resistance available for a desired frequency range. In an extreme example, the load capacitance may be reduced to zero, maximizing the gain of the oscillator circuit. However, reducing the load capacitance of the oscillator circuit can come at the expense of a large frequency shift due to an incorrect load capacitance seen by the resonator.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide increased negative resistance to an oscillator circuit, without changing the total load capacitance or increasing the current consumption of the circuit. In alternate implementations, a capacitance divider and/or a feedback loop may be employed to increase the negative resistance of the oscillator circuit. For example, the load capacitance seen by a resonator of the circuit may be divided into a quantity of sub-capacitances. The sub-capacitances may be coupled to components or portions of the amplifier core(s) of the circuit, resulting in an increase to the negative resistance of the circuit, particularly at higher frequencies.

Additionally or alternately, one or more feedback loops may be coupled to components or portions of the amplifier core(s) of the circuit, forming inverting amplifiers at the components or portions. In some implementations, the inverting amplifiers amplify signals feeding the resonator of the circuit multiple times. This results in a greater negative resistance of the circuit.

In various other implementations, a constant transconductance bias circuit may be employed to conserve and/or reduce the current consumption of the oscillator circuit. For example, the bias circuit may be merged with components or portions of the amplifier core(s) of the circuit, providing a constant bias to the core(s) and/or to the circuit.

Various implementations and techniques for oscillator circuit arrangements are discussed in this disclosure. Techniques and devices are discussed with reference to example resonator-based oscillator devices and systems illustrated in the figures. In some cases, Colpitts-type crystal oscillator designs are shown and discussed. However, this is not intended to be limiting, and is for ease of discussion and illustrative convenience. The techniques and devices discussed may be applied to various oscillator circuit designs, structures, devices, and the like (e.g., single pin oscillators, Pierce oscillators, Hartley oscillators, Butler oscillators, Tritet oscillators, etc.), as well as oscillator circuits using crystals, polycrystalline materials, or non-crystal resonators (such as microelectromechanical system (MEMS) resonators, for example), and remain within the scope of the disclosure. Further, the use of the word "crystal" within the disclosure also refers to any other type of resonator.

Implementations are explained in more detail below using a plurality of examples. Although various implementations and examples are discussed here and below, further implementations and examples may be possible by combining the features and elements of individual implementations and examples.

Example Oscillator Circuit

Figure 1:
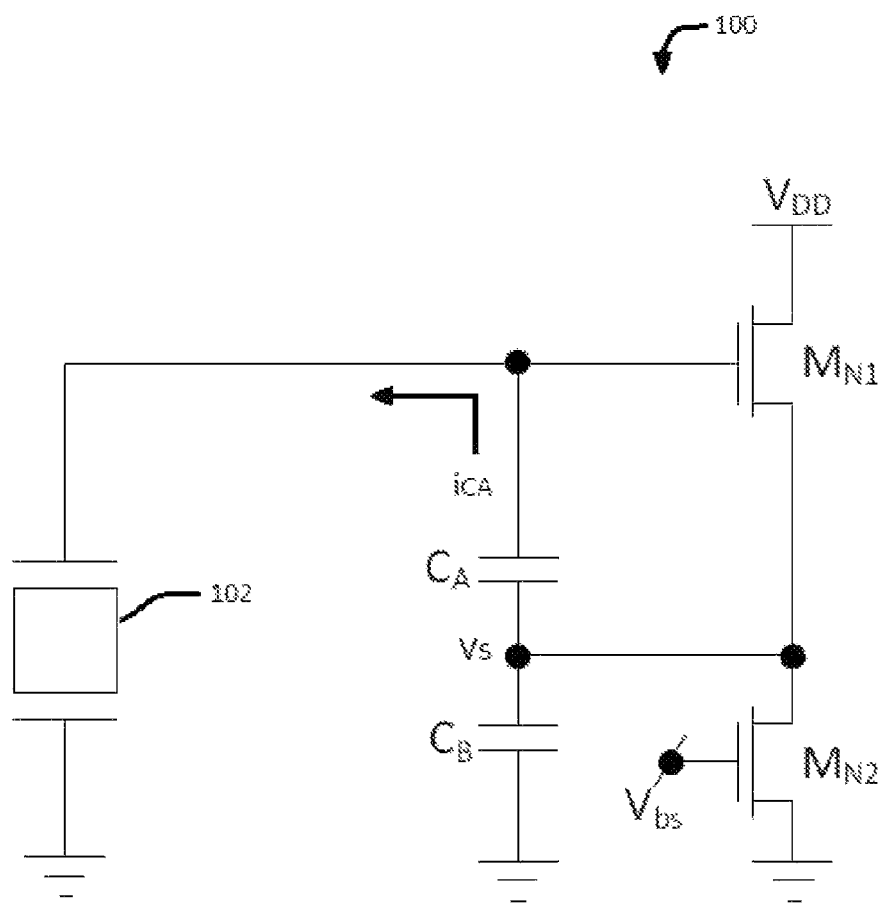
FIG. 1 is a schematic diagram of an example oscillator circuit, wherein the techniques and devices disclosed herein may be applied, according to an implementation.

FIG. 1 is a schematic diagram of an example oscillator circuit 100, wherein the techniques and devices disclosed herein may be applied, according to an implementation. In general, the oscillator circuit 100 produces an output frequency based on the natural resonant frequency of the resonator 102. In various implementations, the output frequency of the circuit 100 may be a multiple of the resonant frequency, or the like.

In various implementations, the resonator 102 (e.g., crystal, non-crystal resonator, etc.) produces a voltage signal when it oscillates. Further, the resonator 102 oscillates (or rings) in response to a signal applied to it, which is at the resonant frequency of the resonator 102. Accordingly, the oscillator circuit 100 can amplify a voltage signal output from the resonator 102, and feed it back to the resonator 102 to provide sustained oscillations.

As shown in FIG. 1, an example oscillator circuit 100 may include a load capacitance (comprising CA and CB, in FIG. 1) and one or more amplifier components (comprising MN1 and MN2, in FIG. 1). In alternate implementations, an example oscillator circuit 100 may include fewer, additional, or alternate components.

In some implementations, the load capacitance may be a series combination of capacitances (e.g., CA+CB) adding up to the desired load capacitance value. The load capacitance (including the series-coupled set of capacitances) may be arranged in parallel to the resonator 102, as shown in FIG. 1. In such an implementation, the load capacitance may be selected based on the desired output frequency of the oscillator circuit 100 or to promote stability of the oscillator circuit 100. For example, the desired output frequency, overtone, and/or the stability of the oscillator circuit 100 may be dependent on the capacitance value of the load capacitance.

For example, in many implementations, the resonator 102 is energized based on a current $i_{CA}$ that passes through at least a part of the load capacitance. For example, in FIG. 1, the current $i_{CA}$ is shown passing through capacitance CA. In alternate implementations, a signal arranged to energize the resonator 102 may pass through various other portions of a circuit 102.

In various implementations, the amplifier components (e.g., MN1 and MN2) may comprise an amplifier core. As such, the amplifier components MN1 and MN2 may work together to amplify circuit signals to be output from the oscillator circuit 100 and/or to be fed back to the resonator 102. For example, a signal at node Vs may be output from the amplifier core (MN1+MN2) and fed to the resonator 102 through capacitance CA. In some implementations, the amplifier components MN1 and MN2 are comprised of transistor devices, such as field-effect transistors, bipolar junction transistors, and the like.

In an implementation, as shown in FIG. 1, one or more portions of the amplifier core (e.g., MN1 and MN2) may be controlled via a signal at node Vbs. For example, the signal at Vbs may determine the current passing through the amplifier core, and thus, the performance of the core and/or the circuit 100. In alternate implementations, the signal at Vbs may be determined by another circuit, system, process, or the like, and may be fixed, adjustable, programmable, and so forth.

In an implementation, as shown in FIG. 1, the resonator 102 is coupled across the amplifier core (MN1 and MN2). The amplifier core (MN1 and MN2) represents a negative resistance component of the circuit 100, since it amplifies a signal from the resonator 102 (based on a bias voltage applied to the core), and thus supplies energy to the circuit 100 and back to the resonator 102, attempting to cancel the damping losses of the resonator 102. If successful, this can produce sustained oscillations from the resonator 102 and the circuit 100.

The negative resistance of the oscillator circuit 100, as seen by the resonator 102, may be expressed with the following equation:

$$\text{Re}\{Z_{in}\} = \frac{-\left(\frac{1}{R_s} + g_{m1}\right)\omega^2 C_A C_B + \omega^2 (C_A + C_B)\frac{C_A}{R_s}}{\omega^4 (C_A C_B + C_o(C_A + C_B))^2 + \omega^2\left(\frac{C_A}{R_s} + C_o\left(\frac{1}{R_s} + g_{m1}\right)\right)^2}$$

Where $R_S$ is the resistance of the current source (resistance of MN2) and $C_O$ is the stray capacitance of the resonator 102. Accordingly, the negative resistance of the oscillator circuit 100 can be dependent on the load capacitance components (CA and CB) as well as the transconductance (gm) of the amplifier core components (MN1) at a desired frequency $\omega$.

In various implementations, an example oscillator circuit 100 may include additional components or alternate components to perform the functions discussed, or for other desired functionality.

Example Negative Resistance Boosting Arrangements

Figure 2:
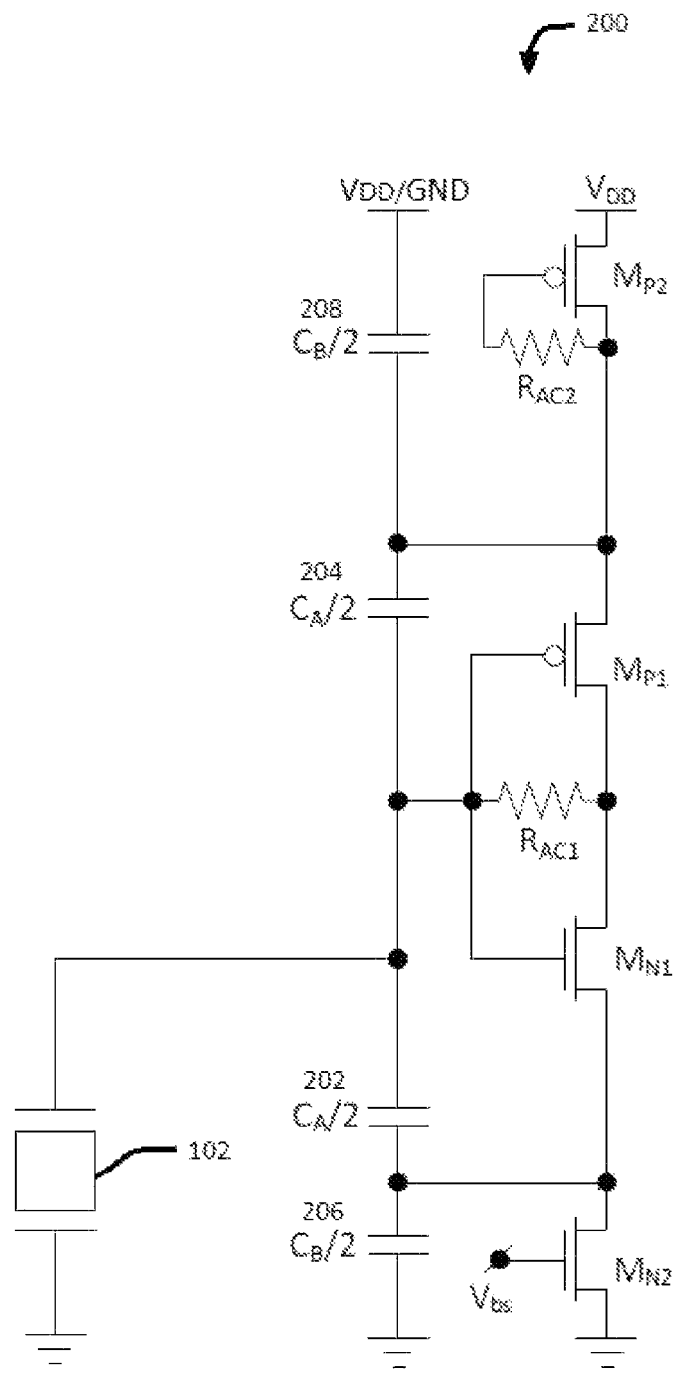
FIG. 2 is a schematic diagram of an example oscillator circuit utilizing a divided-cell technique, according to an implementation. The example oscillator circuit is shown as having multiple capacitance sub-elements.

In various implementations, the negative resistance of an oscillator circuit (such as oscillator circuit 100, for example) can be increased, improving the efficiency of the circuit, without increasing the load capacitance or the current consumption of the circuit, and without upsizing the amplifier core(s). FIG. 2 is a schematic diagram of an example oscillator circuit 200 utilizing one negative resistance boosting technique, according to an implementation. The example oscillator circuit 200 is shown as having multiple capacitance sub-elements based on a divided-cell technique.

The example oscillator circuit 200 represents the oscillator circuit 100 of FIG. 1, with an example divided-cell technique applied. As shown in FIG. 2, the load capacitance of the circuit 200 is in the form of a series-connected capacitance divider (202, 204, 206, and 208) in parallel with the resonator 102. Further, an additional amplifier core comprising components MP1 and MP2 is added to complete the divided cells. For example, the additional amplifier core (MP1 and MP2), a p-type amplifier core, is coupled in series to the previous amplifier core (MN1 and MN2), to make current reuse but they are parallel connected to the resonator.

As shown in FIG. 2, each of the previously described load capacitance components (CA and CB) of the circuit 100 is divided into two smaller sub-capacitances: CA=(CA/2 and CA/2) and CB=(CB/2 and CB/2). Division of the load capacitance components by 2 is an example, and not intended to be limiting. In various implementations, the load capacitance components may be divided into more sub-components having lesser capacitance values each. Accordingly, with a greater quantity of sub-capacitances, additional amplifier cores (n-type or p-type) may be added in series with the previous amplifier core(s) to complete the divided cells.

In an implementation, the divided cells (CA/2, CA/2, CB/2, and CB/2) comprise a sub-capacitance (202, 204, 206, and 208, respectively) coupled to a transistor device (MN1, MP1, MN2, and MP2, respectively) of the amplifier cores. For example, each of the sub-capacitances (202, 204, 206, and 208) is associated with a transistor device (MN1, MP1, MN2, and MP2, respectively) of the pair of amplifier cores, each sub-capacitance (202, 204, 206, and 208) being coupled between two nodes of the associated transistor device (MN1, MP1, MN2, and MP2, respectively).

For example, as shown in FIG. 2, the first sub-capacitance 202 is coupled between a source and a gate of the first transistor device MN1 of the first amplifier core (MN1 and MN2). Additionally, the second sub-capacitance 204 is coupled between a source and a gate of the first transistor device MP1 of the second amplifier core (MP1 and MP2).

In an implementation, the second sub-capacitance 204 has a substantially equivalent capacitance value to the first sub-capacitance 202. In the implementation, the sub-capacitances 202 and 204 have substantially equivalent capacitance values, since they comprise the previous capacitance component CA value divided in half. For the purposes of this disclosure, "substantially equivalent" is defined to represent values that are intended to be equal, and are within industry acceptable tolerances due to manufacturing, process, quality control, and the like. In various implementations, and for different ranges of capacitance values, the acceptable tolerances may vary (e.g., ±0.5%, ±1.0%, ... ±5.0%, etc.).

Additionally, as shown in FIG. 2, the third sub-capacitance 206 is coupled between a source and a drain of the second transistor device MN2 of the first amplifier core (MN1 and MN2), and the fourth sub-capacitance 208 is coupled between a source and a drain of the second transistor device MP2 of the second amplifier core (MP1 and MP2). Further, the fourth sub-capacitance 208 has a substantially equivalent capacitance value to the third sub-capacitance 206, based on dividing the previous capacitance component CB value in half.

In alternate implementations, the sub-capacitances (202, 204, 206, and 208) may be coupled in a different manner to the transistor devices of the first (MN1 and MN2) and second (MP1 and MP2) amplifier cores to make up the divided cells. As mentioned above, in alternate implementations, the circuit 200 may include more divided cells, with sub-capacitance and amplifier core components coupled in a similar manner.

Referring to the equation representing negative resistance as seen by the resonator 102, the high frequency negative resistance $Re\{Z_{in}\}$ may be increased by a multiplier of approximately 16 using the divided cell technique described. This is due to the reduction in capacitance values: CA/2 and CB/2, as well as the $\omega^4$ term at the denominator of the equation (the multiplier is approximately 16 if $C_0=0$ but less than 16 if $C_0 \neq 0$).

In an implementation, as shown in FIG. 2, the resonator 102 still sees the same load capacitance, because both p-type (MP1, MP2) and n-type (MN1, MN2) capacitive dividers appear in parallel to the resonator 102. In such an implementation, the desired oscillation frequency of the oscillator circuit 100 may be based on a capacitance value of the load capacitance. For example, the desired output frequency, overtone, and/or the stability of the oscillator circuit 100 may be dependent on the capacitance value of the load capacitance. In one implementation, also shown in FIG. 2, resistors $R_{AC1}$ and $R_{AC2}$ are used to self-bias the gates of MN1, MP1, and MP2.

Figure 3:
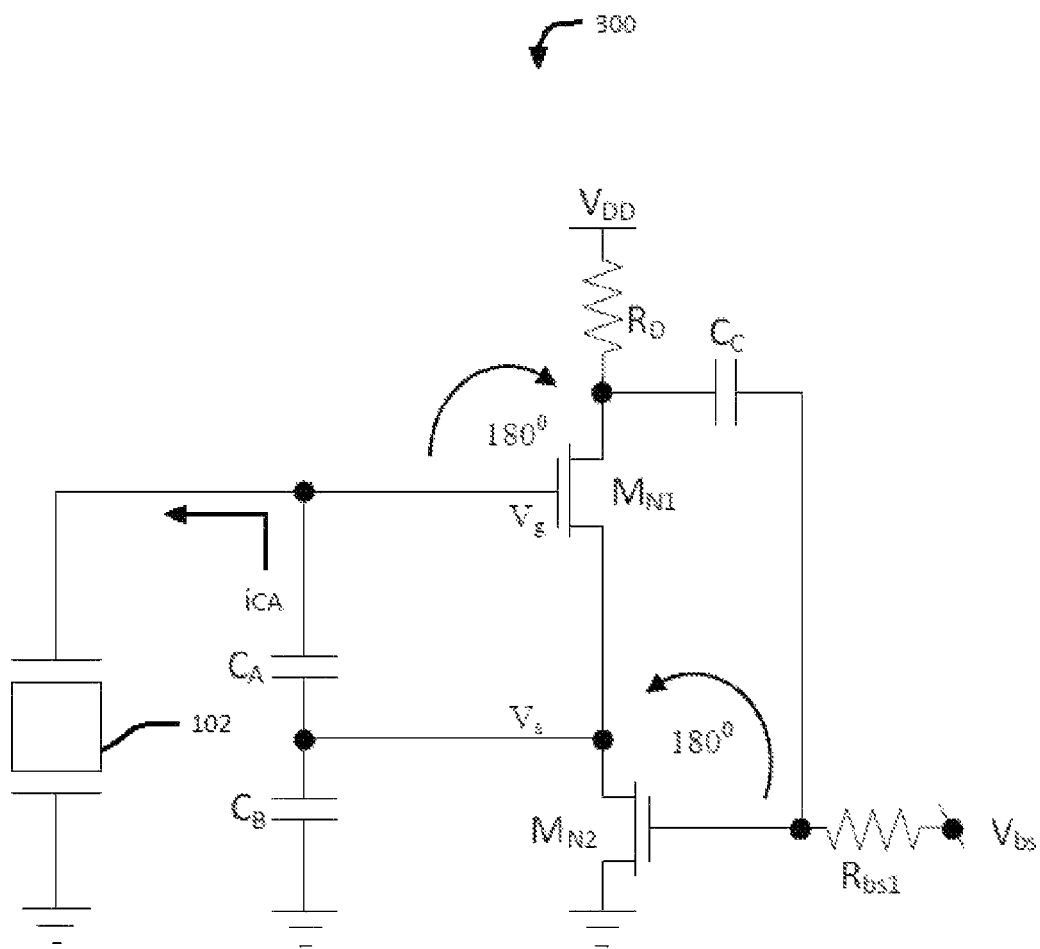
FIG. 3 is a schematic diagram of an example oscillator circuit utilizing a negative resistance boosting technique using feedback, according to an implementation.

In another implementation, the negative resistance of an oscillator circuit can be increased, improving the efficiency of the circuit, without increasing the load capacitance or the current consumption of the circuit, and without upsizing the amplifier core(s). FIG. 3 is a schematic diagram of an example oscillator circuit 300 utilizing a negative resistance boosting technique using feedback, according to an implementation.

The example oscillator circuit 300 represents the oscillator circuit 100 of FIG. 1, with an example feedback technique applied. In an implementation, as shown in FIG. 3, the amplifier core comprises at least a first transistor device MN1 and a second transistor device MN2 coupled in series. Additionally, the circuit 300 includes a load capacitance comprising at least two sub-capacitances CA and CB. In the implementation, the first sub-capacitance CA is coupled between a source and a gate of the first transistor device MN1 and the second sub-capacitance CB is coupled between a source and a drain of the second transistor device MN2.

In various implementations, as shown in FIG. 3, a feedback loop arranged to increase a negative resistance of the oscillator circuit 300 is coupled from a drain of the first transistor device MN1 to a gate of the second transistor device MN2. In one implementation, the feedback loop includes a series capacitance $C_C$.

In an implementation, the feedback loop is configured to couple a voltage signal at node Vg at a gate of the first transistor MN1 to the source node Vs of the first transistor MN1. In the implementation, the voltage signal at Vg is amplified and inverted at least twice based on coupling the voltage signal at node Vg to node Vs.

For example, as mentioned above, the current $i_{CA}$ flowing to the resonator 102 also flows through at least a portion of the load capacitance. As shown in FIG. 3, the current $i_{CA}$ flows at least through capacitance CA. The current $i_{CA}$ may be expressed as:

$$i_{CA} = j\omega C_A(v_s - v_g)$$

Where Vs is the voltage signal at the source node Vs of MN1 and Vg is the voltage signal at the gate node Vg of MN1. To have a negative resistance at the resonator 102, $i_{CA}$ has to be positive. This means that the voltage at Vs is greater than the voltage at Vg, and of the same phase.

In an implementation, as shown in FIG. 3, the feedback loop, in combination with resistors $R_D$ and Rbs1, modifies the topology of the oscillator circuit 300. In an example, the transistor device MN1 and the resistor $R_D$ act as a common source inverting amplifier. As a result, there is a 180 degree phase shift from the gate to the drain of MN1. The common source gain of the inverting amplifier of MN1 can be expressed as:

$$A_{v,MN1} = \frac{R_D}{r_{o,N2}}$$

Where $r_{o,N2}$ is the output resistance of MN2. To maximize the gain $A_{v,MN1}$, MN2 may be selected to have a small output resistance $r_{o,N2}$. In an implementation, the voltage signal at node Vg is inverted and amplified as it is coupled from the gate to the drain of MN1.

In an implementation, the output of the inverting amplifier of MN1 is coupled, using capacitance Cc, to the gate of MN2. Based on the modified topology of circuit 300, as shown in FIG. 3, and due to the feedback loop and resistance Rbs1, MN2 and Rbs1 also act as a common source inverting amplifier. As a result, there is another 180 degree phase shift from the gate to the drain of MN2 (i.e., the source of MN1). In an implementation, the voltage signal at the gate of MN2 is inverted and amplified as it is coupled from the gate to the drain of MN2 (i.e., node Vs).

In the implementation, the voltage signal is inverted twice and amplified twice as it is coupled from node Vg to node Vs, via the feedback loop, increasing the potential at node Vs. The negative resistance of the oscillator circuit 300 is increased due to an increase in current $i_{CA}$ through at least a portion of the load capacitance (e.g., CA), based on the coupling of the voltage signal from node Vg to node Vs.

In the example given and illustrated, a voltage signal is inverted and amplified twice to provide negative resistance boosting to a circuit 300. However, this is an example, and not intended to be limiting. In alternate implementations, additional or alternate amplifier arrangements may be used to invert and/or amplify a signal to boost the negative resistance of a circuit 300, as described above.

Example Implementations

In various implementations, negative resistance boosting techniques, as described with regard to FIGS. 2 and 3, may be used in combination with each other, or in combination with other techniques to further increase the negative resistance of an oscillator circuit, such as circuits 100, 200, and 300. For example, FIG. 4 shows a schematic diagram of an example oscillator circuit 400 utilizing a divided-cell technique and a negative resistance boosting feedback technique, according to another implementation.

Figure 4:
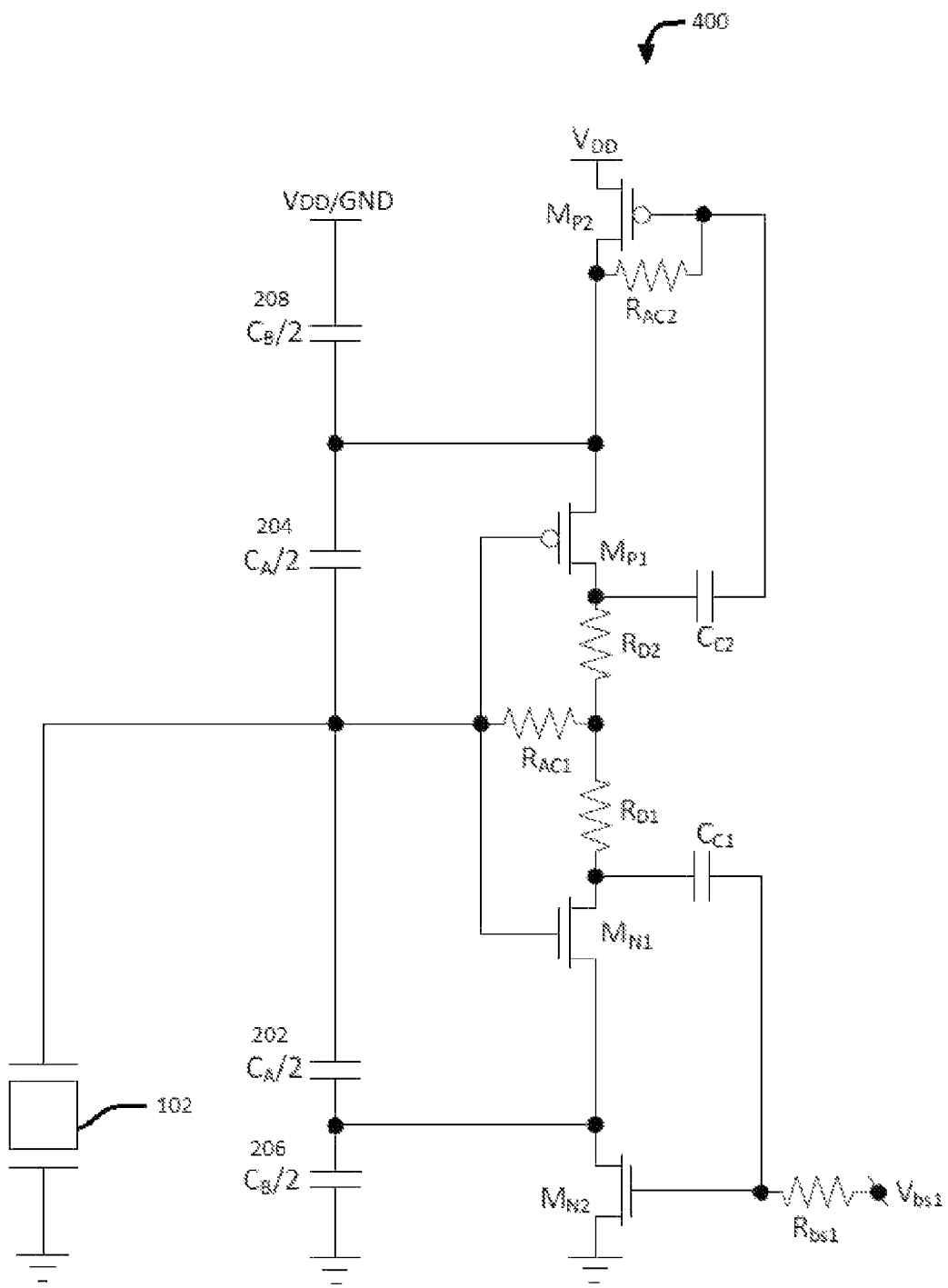
FIG. 4 is a schematic diagram of an example oscillator circuit utilizing a divided-cell technique and a feedback technique, according to another implementation.

As shown in FIG. 4, an oscillator circuit 400 may include each of the components, elements, and features of an oscillator circuit 200, and also include at least one feedback loop, as described with regard to FIG. 3. In one implementation, as shown in FIG. 4, the circuit 400 includes a first feedback loop coupled from a drain of a first transistor device MN1 of a first amplifier core (MN1 and MN2) to a gate of a second transistor device MN2 of the first amplifier core (MN1 and MN2) and a second feedback loop coupled from a drain of a first transistor device MP1 of a second amplifier core (MP1 and MP2) to a gate of a second transistor device MP2 of the second amplifier core (MP1 and MP2). In the implementation, the first feedback loop and/or the second feedback loop are configured to increase the negative resistance of the oscillator circuit 400, as described above with reference to circuit 300 of FIG. 3.

In an implementation, as illustrated in FIG. 4, at least one of the first feedback loop and the second feedback loop includes at least one series capacitance (such as Cc1 and/or Cc2). In the implementation, the series capacitance (Cc1 and/or Cc2) aids in coupling and amplifying a voltage signal as described above with regard to FIG. 3.

In an alternate implementation, the circuit 400 of FIG. 4 includes each of the components, elements, and features of an oscillator circuit 300, and also includes at least one additional amplifier core and associated set of divided cells, as described with regard to FIG. 2. For example, the circuit 400 comprises the circuit 300, plus a second amplifier core (MP1 and MP2) coupled in series with the first amplifier core (MN1 and MN2), where the second amplifier core (MP1 and MP2) comprises at least a third transistor device MP1 and a fourth transistor device MP2 coupled in series, in addition to the first MN1 and second MN2 transistor devices.

In the implementation, the circuit 400 includes a second feedback loop coupled from a source of the third transistor device MP1 to a gate of the fourth transistor device MP2, in a similar manner as described with reference to circuit 300 of FIG. 3. In the implementation, the second feedback loop forms a pair of inverting amplifiers using the transistor devices (MP1 and MP2) of the p-type amplifier core, similar as described above with respect to the n-type amplifier core (MN1 and MN2).

For example, the second feedback loop is configured to couple another voltage signal at a gate of the third transistor device MP1 to a drain of the third transistor device MP1, the other voltage signal being amplified and inverted at least twice based on the coupling of the other voltage signal from the gate to the drain of MP1, similar as described above. Further, the negative resistance of the oscillator circuit 400 is increased due to an increase in current through at least a portion of the load capacitance (capacitance 204, for example), based on the coupling of the other voltage signal from the gate to the drain of MP1, similar as described above.

In an implementation, the load capacitance (CA and CB) is divided into a plurality of sub-capacitances (202, 204, 206, and 208), including: a first sub-capacitance 202 coupled between a source and a gate of the first transistor device MN1, a second sub-capacitance 204 coupled between a gate and a source of the third transistor device MP1, a third sub-capacitance 206 coupled between a source and a drain of the second transistor device MN2, and a fourth sub-capacitance 208 coupled between a source and a drain of the fourth transistor device MP2. In an example, as described above, the third sub-capacitance 206 has a substantially equivalent capacitance value to the first sub-capacitance 202 and the fourth sub-capacitance 208 has a substantially equivalent capacitance value to the second sub-capacitance 204, based on the capacitances CA and CB divided in half to form the sub-capacitances (202, 204, 206, and 208).

In an implementation, the negative resistance of the oscillator circuit 400 (or 200) is based on a quantity of the sub-capacitances (202, 204, 206, and 208), based on the equation for negative resistance seen by the resonator 102, described above. Since it is desirable for the load capacitance to remain unchanged (i.e., matched for the oscillator circuit 200 or 400, based on the desired output frequency and for stability of the circuit 200 or 400), dividing the load capacitance into multiple sub-capacitances (202, 204, 206, and 208) forms smaller sub-capacitances with each further division (e.g., each larger divisor). The smaller sub-capacitances work with the desired frequency $\omega$ to increase the negative resistance of the circuit (200 or 400).

In alternate implementations, the capacitances CA and CB may be divided differently (in thirds, fourths, etc.) to form the divided cells of the circuit 200 or 400. In such alternate implementations, additional or alternate amplifier cores may be used to form the divided cells.

Figure 5:
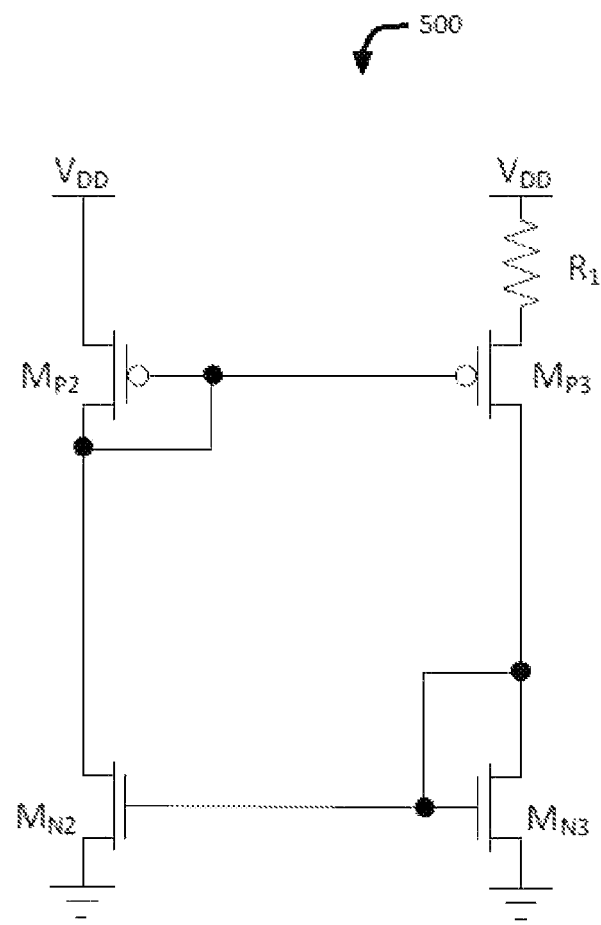
FIG. 5 is a schematic diagram of an example constant transconductance bias circuit, according to an implementation.

In various implementations, a constant transconductance bias technique may be used with an oscillator circuit (200 or 400) to generate a stable transconductance for the circuit (200 or 400), resulting in a constant current, and conserving the current consumption of the circuit (200 or 400). FIG. 5 is a schematic diagram of an example constant transconductance bias (gm.R) circuit 500, according to an implementation.

As shown in FIG. 5, a constant transconductance bias (gm.R) circuit 500 may include at least one complementary metal-oxide-semiconductor (CMOS) device pair (MN3, MP3). In an implementation, the constant gm.R bias circuit 500 forces the current in the MP3 branch such that $gm_{p3}.R1$ is a constant value. In various implementations, the transconductance (gm) of the circuit 500 is proportional or inversely proportional to the resistance value of R1. Further, if MP2 and MP3 are matched, then $gm_{p2}.R1$ is a constant value as well.

In an implementation, as shown in FIG. 5, a portion of the constant gm.R bias circuit 500 is similar or equal to a portion of an example oscillator circuit 200 or 400. For example, as shown in FIGS. 2, 4, and 5, the transistor devices MP2 and MN2 are common between the circuits 200, 400, and 500. Accordingly, the circuit 500 may be merged or incorporated into a circuit 200 or 400, to provide stable transconductance to the circuit 200 or 400.

Figure 6:
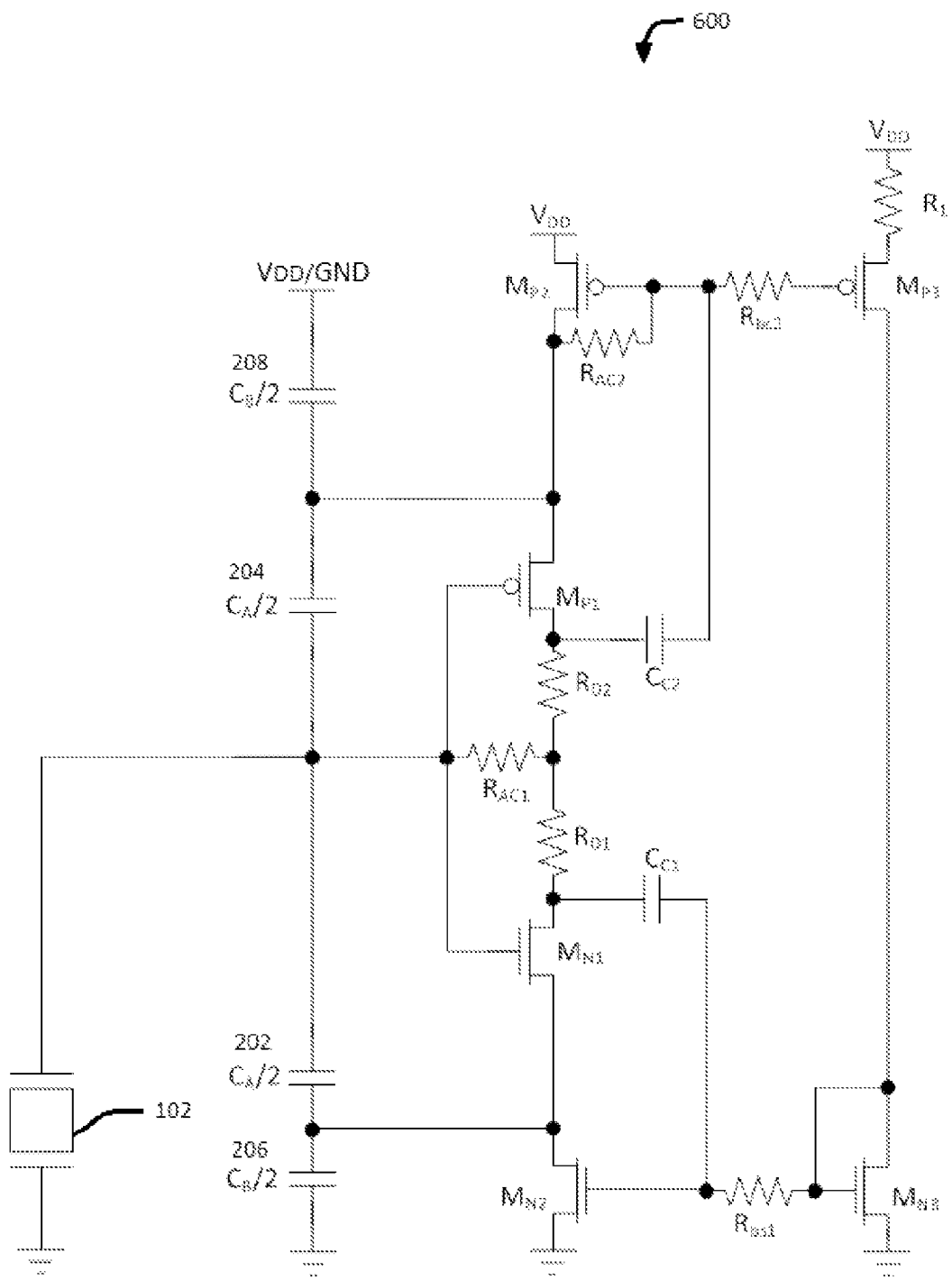
FIG. 6 is a schematic diagram of the example oscillator circuit of FIG. 4, utilizing a constant transconductance bias technique, as shown in FIG. 5, according to an implementation.

FIG. 6 is a schematic diagram of an example oscillator circuit 600, comprising the example oscillator circuit 400 of FIG. 4, utilizing a constant transconductance bias technique, as shown in FIG. 5, according to an implementation. In an alternate implementation, the circuit 200 of FIG. 2 may also use the constant transconductance bias technique as described herein.

In an example, the circuit 600 comprises a circuit 200 or 400 merged with a constant transconductance bias (gm.R) circuit 500 arranged to reduce current consumption of the oscillator circuit, by stabilizing the transconductance of the amplifier core branch (MN1, MN2, MP1, and MP2). In an implementation, a gate of each CMOS device (MN3 and MP3) of the CMOS pair of the gm.R circuit is coupled to a gate of a transistor device (MN2 and MP2, respectively) of each of the pair of amplifier cores (MN1 and MN2) and (MP1 and MP2).

In an implementation, merging the constant gm.R bias circuit 500 with the oscillator circuits 200 and 400 to form the circuit 600 results in saving the current consumed at the MP2 branch at the constant gm.R bias circuit. In various alternate implementations, additional or alternate components may be used to form the constant gm.R bias portion of the circuit 600.

As discussed above, the techniques, components, and devices described herein with respect to the implementations are not limited to the illustration of FIGS. 2-6, and may be applied to other oscillator devices and designs without departing from the scope of the disclosure. In some cases, additional or alternative components may be used to implement the techniques described herein. Further, the components may be arranged and/or combined in various combinations, while resulting in an increased negative resistance. It is to be understood that an oscillator circuit 200, 300, 400, or 600 may be implemented as a stand-alone device or as part of another system (e.g., integrated with other components, systems, etc.). In various implementations, additional or alternative components may be used to accomplish the disclosed techniques and arrangements.

Representative Process

Figure 7:
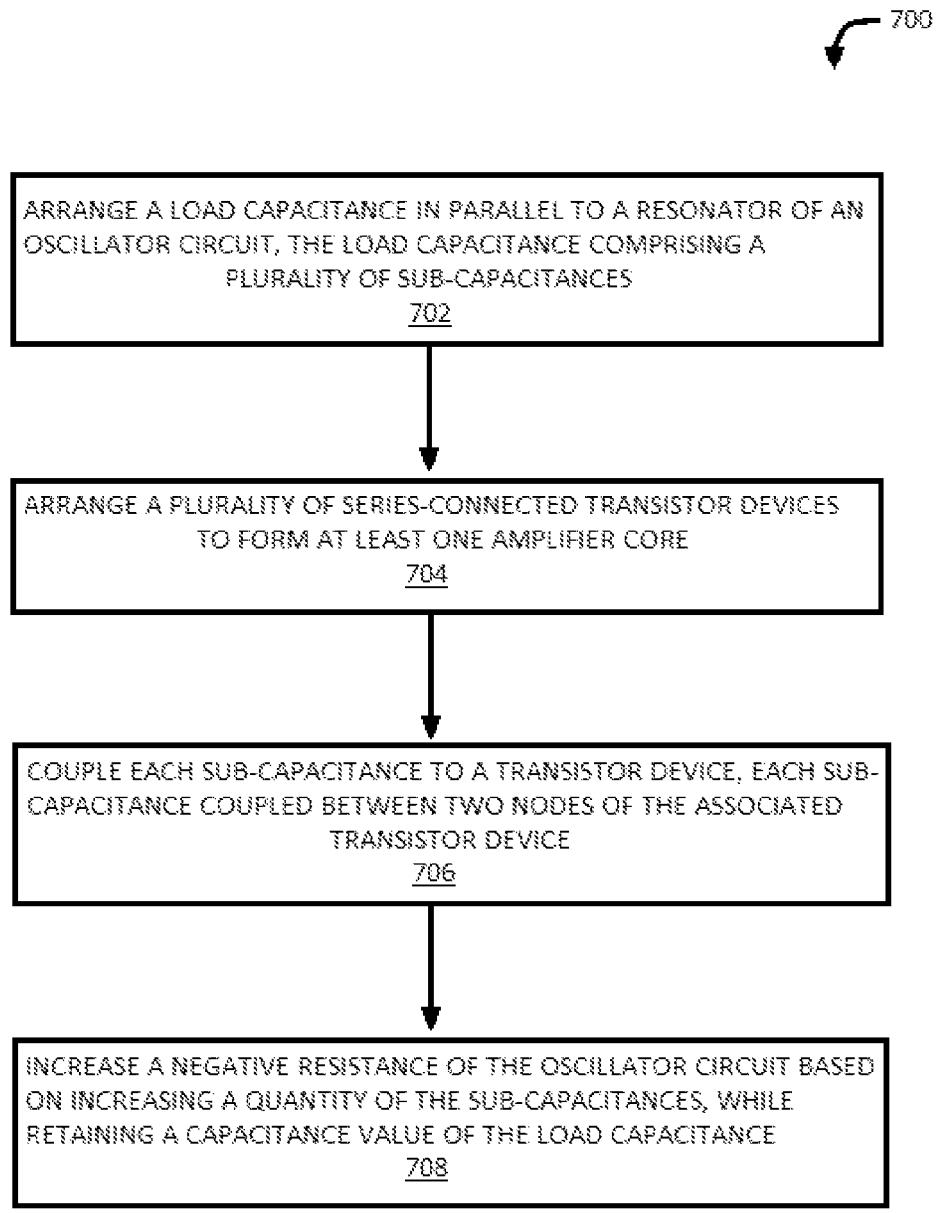
FIG. 7 is a flow diagram illustrating an example process for efficiently providing oscillations utilizing negative resistance boosting techniques, according to an implementation.

FIG. 7 is a flow diagram illustrating an example process 700 for providing an increased negative resistance to an oscillator circuit (such as oscillator circuits 100, 200, 300, 400, or 600, for example) according to various implementations. The process 700 describes using a divided-cell technique, a feedback technique, or a combination of the techniques. The process 500 is described with reference to FIGS. 1-4.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 702, the process 700 includes arranging a load capacitance (such as capacitances CA and CB, for example) in parallel to a resonator (such as resonator 102, for example) of an oscillator circuit. In an implementation, the load capacitance comprises a plurality of sub-capacitances (such as sub-capacitances 202, 204, 206, and 208, for example).

At block 704, the process includes arranging a plurality of series-connected transistor devices (such as transistor devices MN1 and MN2, for example) to form at least one amplifier core. In an alternate implementation, the plurality of series-connected transistor devices includes multiple transistor devices (such as MN1, MN2, MP1, and MP2, for example) forming a plurality of amplifier cores.

In one implementation, the process includes arranging at least two pairs of series-connected transistor devices (such as MN1, MN2, MP1, and MP2, for example) to form at least two amplifier cores and coupling a sub-capacitance between two nodes of each transistor device of the at least two amplifier cores.

At block 706, the process includes coupling each sub-capacitance of the plurality of sub-capacitances to a transistor device of the plurality of transistor devices, each sub-capacitance coupled between two nodes of the associated transistor device. In various implementations, this forms a plurality of divided cells, where each divided cell includes a sub-capacitance coupled to a transistor device.

At block 708, the process includes increasing a negative resistance of the oscillator circuit based on increasing a quantity of the sub-capacitances of the plurality of sub-capacitances, while retaining a capacitance value of the load capacitance. For example, the load capacitance may be divided into any number of sub-capacitances, making each sub-capacitance have a capacitance value that is a fraction of the load capacitance. In an implementation, as the quantity of sub-capacitances increases, the capacitance value of each decreases, making the negative resistance of the circuit increase, particularly for higher frequencies $\omega$, based on the formula for negative resistance:

$$\text{Re}\{Z_{in}\} = \frac{-\left(\frac{1}{R_s} + g_{m1}\right)\omega^2 C_A C_B + \omega^2 (C_A + C_B)\frac{C_A}{R_s}}{\omega^4 (C_A C_B + C_o(C_A + C_B))^2 + \omega^2 \left(\frac{C_A}{R_s} + C_o\left(\frac{1}{R_s} + g_{m1}\right)\right)^2}$$

In one implementation, one or more pairs of sub-capacitances of the plurality of sub-capacitances comprise sub-capacitances having substantially equivalent capacitance values.

In an implementation, the process includes forming a plurality of inverting amplifiers using the transistor devices and one or more feedback loops, and increasing a negative resistance of the oscillator circuit based on inverting and amplifying a signal using the plurality of inverting amplifiers. For example, the inverting amplifiers may be formed based on feeding a signal from a gate of a first transistor device back to a drain of second transistor device, where the first and second transistor devices are a pair forming an amplifier core of the oscillator circuit.

In one implementation, the process includes merging a constant transconductance (gm.R) bias circuit (such as the constant gm.R bias circuit 500, for example) with at least one amplifier core, and conserving a current consumed at the oscillator circuit based on the constant gm.R bias circuit.

In alternate implementations, other techniques may be included in the process 700 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:
1. An oscillator circuit, comprising:
a resonator;
a pair of amplifier cores coupled in series, each of the amplifier cores comprising at least a first transistor device and a second transistor device;
a load capacitance coupled in parallel to the resonator, the load capacitance divided into a plurality of sub-capacitances, each of the sub-capacitances associated with a transistor device of the pair of amplifier cores, each sub-capacitance coupled between two nodes of the associated transistor device; and at least one of a first feedback loop coupled from a drain of a first transistor device of a first amplifier core to a gate of a second transistor device of the first amplifier core and a second feedback loop coupled from a drain of a first transistor device of a second amplifier core to a gate of a second transistor device of the second amplifier core, the first feedback loop and/or the second feedback loop configured to increase a negative resistance of the oscillator circuit.

2. The circuit of claim 1, wherein the at least one of the first feedback loop and the second feedback loop includes at least one series capacitance.

3. The circuit of claim 1, further comprising a constant transconductance bias (gm.R) circuit arranged to reduce current consumption of the oscillator circuit, the gm.R circuit including at least one complementary metal-oxide-semiconductor (CMOS) device pair, wherein a gate of each CMOS device of the CMOS pair is coupled to a gate of a transistor device of each of the pair of amplifier cores.

4. The circuit of claim 1, wherein a desired oscillation frequency of the oscillator circuit is based on a capacitance value of the load capacitance.

5. The circuit of claim 1, wherein the plurality of sub-capacitances includes a first sub-capacitance coupled between a source and a gate of a first transistor device of a first amplifier core.

6. The circuit of claim 5, wherein the plurality of sub-capacitances includes a second sub-capacitance coupled between a source and a gate of a first transistor device of a second amplifier core, the second sub-capacitance having a substantially equivalent capacitance value to the first sub-capacitance.

7. The circuit of claim 6, wherein the plurality of sub-capacitances includes a third sub-capacitance coupled between a source and a drain of a second transistor device of the first amplifier core.

8. The circuit of claim 7, wherein the plurality of sub-capacitances includes a fourth sub-capacitance coupled between a source and a drain of a second transistor device of the second amplifier core, the fourth sub-capacitance having a substantially equivalent capacitance value to the third sub-capacitance.

9. An oscillator circuit, comprising:
a resonator;
a load capacitance coupled in parallel to the resonator;
an amplifier core comprising at least a first transistor device and a second transistor device coupled in series;
a feedback loop coupled from a drain of the first transistor device to a gate of the second transistor device, the feedback loop arranged to increase a negative resistance of the oscillator circuit; and
wherein the load capacitance includes at least two sub-capacitances, a first sub-capacitance coupled between a source and a gate of the first transistor device and a second sub-capacitance coupled between a source and a drain of the second transistor device.

10. The circuit of claim 9, the feedback loop further comprising a series capacitance.

11. The circuit of claim 9, wherein the feedback loop is configured to couple a voltage signal at a gate of the first transistor to a source of the first transistor, the voltage signal amplified and inverted at least twice based on the coupling of the voltage signal.

12. The circuit of claim 11, wherein the negative resistance of the oscillator circuit is increased due to an increase in current through at least a portion of the load capacitance, based on the coupling of the voltage signal.

13. The circuit of claim 9, further comprising a second amplifier core coupled in series with the amplifier core, the second amplifier core comprising at least a third transistor device and a fourth transistor device coupled in series, and a second feedback loop, the second feedback loop coupled from a drain of the third transistor device to a gate of the fourth transistor device.

14. The circuit of claim 13, wherein the second feedback loop is configured to couple another voltage signal at a gate of the third transistor device to a source of the third transistor device, the other voltage signal amplified and inverted at least twice based on the coupling of the other voltage signal, and wherein the negative resistance of the oscillator circuit is increased due to an increase in current through at least a portion of the load capacitance, based on the coupling of the other voltage signal.

15. The circuit of claim 13, wherein the load capacitance is divided into a plurality of sub-capacitances, including: a first sub-capacitance coupled between a source and a gate of the first transistor device, a second sub-capacitance coupled between a gate and a source of the third transistor device, a third sub-capacitance coupled between a source and a drain of the second transistor device, and a fourth sub-capacitance coupled between a source and a drain of the fourth transistor device, and wherein the third sub-capacitance has a substantially equivalent capacitance value to the first sub-capacitance and the fourth sub-capacitance has a substantially equivalent capacitance value to the second sub-capacitance.

16. The circuit of claim 15, wherein the negative resistance of the oscillator circuit is based on a quantity of the sub-capacitances.

17. The circuit of claim 13, further comprising a constant transconductance bias (gm.R) circuit arranged to reduce current consumption by the oscillator circuit, the gm.R circuit including at least one complementary metal-oxide-semiconductor (CMOS) device pair, wherein a gate of one CMOS device of the CMOS pair is coupled to a gate of the second transistor device and a gate of another CMOS device of the CMOS pair is coupled to a gate of the fourth transistor device.

18. A method, comprising:
arranging a load capacitance in parallel to a resonator of an oscillator circuit, the load capacitance comprising a plurality of sub-capacitances;
arranging a plurality of series-connected transistor devices to form at least one amplifier core;
coupling each sub-capacitance of the plurality of sub-capacitances to a transistor device of the plurality of transistor devices, each sub-capacitance coupled between two nodes of the associated transistor device; and
increasing a negative resistance of the oscillator circuit based on increasing a quantity of the sub-capacitances of the plurality of sub-capacitances while retaining a capacitance value of the load capacitance.

19. The method of claim 18, further comprising arranging at least two pairs of series-connected transistor devices to form at least two amplifier cores and coupling a sub-capacitance between two nodes of each transistor device of the at least two amplifier cores.

20. The method of claim 18, further comprising forming a plurality of inverting amplifiers using the transistor devices and one or more feedback loops, and increasing a negative resistance of the oscillator circuit based on inverting and amplifying a signal using the plurality of inverting amplifiers.

21. The method of claim 18, further comprising merging a constant bias circuit with the at least one amplifier core, and conserving a current consumed at the oscillator circuit based on the constant bias circuit.

22. The method of claim 18, wherein one or more pairs of sub-capacitances of the plurality of sub-capacitances comprise sub-capacitances having substantially equivalent capacitance values.

23. An oscillator circuit, comprising:
- a crystal resonator;
- a p-type amplifier core coupled in series to an n-type amplifier core, each of the amplifier cores comprising at least two transistor devices;
- a pair of load capacitances coupled in parallel to the crystal resonator, each of the load capacitances divided into at least two substantially equivalent sub-capacitances, each of the sub-capacitances coupled between two nodes of a transistor device of the amplifier cores;
- a first feedback loop coupled to each of the transistor devices of the p-type amplifier core, the first feedback loop forming a first pair of inverting amplifiers using the transistor devices of the p-type amplifier core; and
- a second feedback loop coupled to each of the transistor devices of the n-type amplifier core, the second feedback loop forming a second pair of inverting amplifiers using the transistor devices of the n-type amplifier core.

* * * * *